(12) United States Patent
Emma et al.

(10) Patent No.: US 8,141,020 B2
(45) Date of Patent: Mar. 20, 2012

(54) TEMPERATURE-CONTROLLED 3-DIMENSIONAL BUS PLACEMENT

(75) Inventors: Philip G. Emma, Yorktown Heights, NY (US); Eren Kursun, Yorktown Heights, NY (US); Jude A. Rivers, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 12/493,599

(22) Filed: Jun. 29, 2009

(65) Prior Publication Data

US 2010/0333056 A1 Dec. 30, 2010

(51) Int. Cl.
*G06F 17/50* (2006.01)
(52) U.S. Cl. ......... 716/119; 716/118; 716/122; 716/123
(58) Field of Classification Search .................. 716/118, 716/119, 122, 123
See application file for complete search history.

(56) References Cited

U.S. PATENT DOCUMENTS

| | | | | |
|---|---|---|---|---|
| 3,290,559 | A * | 12/1966 | Kirby | 361/733 |
| 3,505,499 | A * | 4/1970 | Walther | 219/439 |
| 6,700,912 | B2 * | 3/2004 | Hayakawa | 372/43.01 |

OTHER PUBLICATIONS

Kokkas, "Thermal Analysis of Multiple-Level Structure", Nov. 1974, IEEE Transactions on Electronic Devices, vol. 21, iss. 11, pp. 674-681.*
Aturk et al., "Coupled Simulation of Device Performance and Heating of Vertically Stacked Three-Dimensional Integrated Circuits", Sep. 2005, Technical Digest, International Conference on Simulation of Semiconductor Processes and Devices (SISPAD), pp. 115-118.*
Li et al., "A Novel Thermal Optimization Flow Using Incremental Floorplanning for 3D ICs", Jan. 2009, Technical Digest, Asia and South Pacific Design Automation Conference, pp. 347-352.*

* cited by examiner

*Primary Examiner* — Sun Lin
(74) *Attorney, Agent, or Firm* — Scully, Scott, Murphy & Presser, P.C.; Gail H. Zarick, Esq.

(57) ABSTRACT

Block placement within each device-containing layer is optimized under the constraint of a simultaneous optimization of interlayer connectivity between the device-containing layer and immediately adjacent device-containing layers. For each functional block within the device-containing layer, lateral heat flow is calculated to laterally adjacent functional blocks. If the lateral heat flow is less than a threshold value for a pair of adjacent functional blocks, placement of the functional blocks and/or interlayer interconnect structure array therebetween or modification of the interlayer interconnect structure array is performed. This routine is repeated for all adjacent pairs of functional blocks in each of the device-containing layers. Subsequently, block placement within each device-containing layer may be optimized under the constraint of a simultaneous optimization of interlayer connectivity across all device-containing layers. This method provides a design having sufficient lateral heat flow in each of the device-containing layers in a semiconductor chip.

24 Claims, 9 Drawing Sheets

TEMPERATURE-CONTROLLED 3-DIMENSIONAL BUS PLACEMENT

BACKGROUND

The present invention generally relates to methods of designing a three-dimensional semiconductor chip including a plurality of layers, an apparatus for effecting the methods, and a storage medium including an executable program for effecting the methods.

A plurality of device-containing layers may be vertically integrated to form a three-dimensionally integrated semiconductor chip. Typically, each device-containing layer includes a semiconductor layer and a metal interconnect layer. Each semiconductor layer includes an integrated circuit of semiconductor devices, and each of the metal interconnect layer includes metal interconnect structures embedded in at least one dielectric layer. The plurality of device-containing layers are individually and separately formed employing conventional semiconductor processing steps, and then vertically stacked to form the three-dimensionally integrated semiconductor chip.

Figure 1:
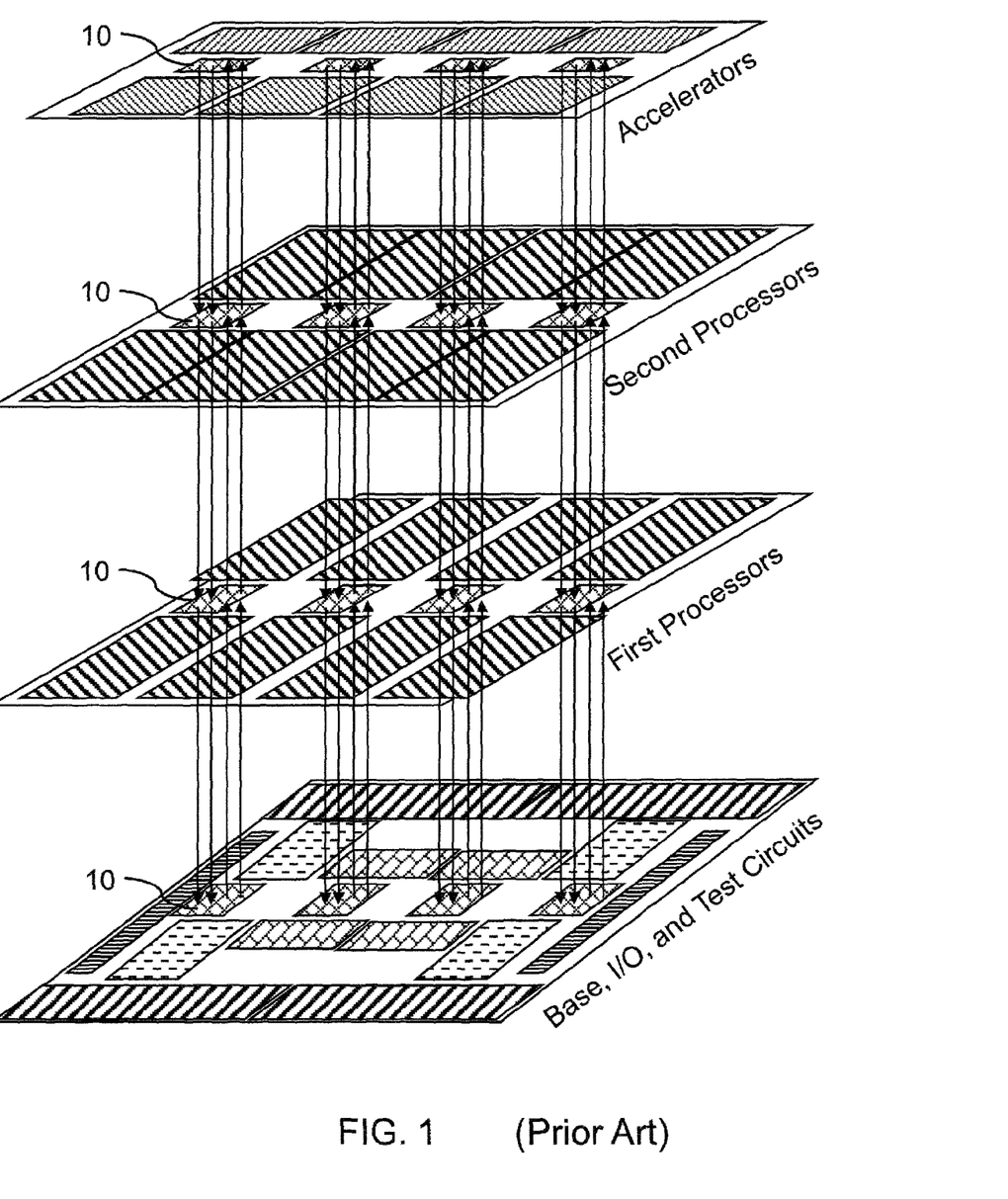
FIG. 1 is a schematically diagram of a prior art three-dimensionally integrated semiconductor chip.

FIG. 1 schematically shows a prior art three-dimensionally integrated semiconductor chip, which includes a first-device-containing layer labeled "Base, I/O, and Test Circuits," a second device-containing layer labeled "First Processors," a third device-containing layer labeled "Second Processors," and a fourth device-containing layer labeled "Accelerators." Each device-containing layer includes a plurality of "functional blocks," which are functional units of an integrated circuit within a device-containing layer. A functional block may be a single chiplet or a set of multiple chiplets. Alternatively, a plurality of functional blocks may form a single chiplet. The functional blocks of the prior art three-dimensionally integrated semiconductor chip are schematically shown as rectangles. The different functions that the functional blocks may perform are schematically shown by the differences in the hatching style of the functional blocks.

Each device-containing layer further includes a plurality of interlayer interconnect structure arrays 10 that include vertical interconnect structures. The vertical interconnect structures provide electrical connection between vertically neighboring device-containing layers. The electrical connections provided by the vertical interconnect structures are schematically shown by arrows between the interlayer interconnect structure arrays.

Figure 2:
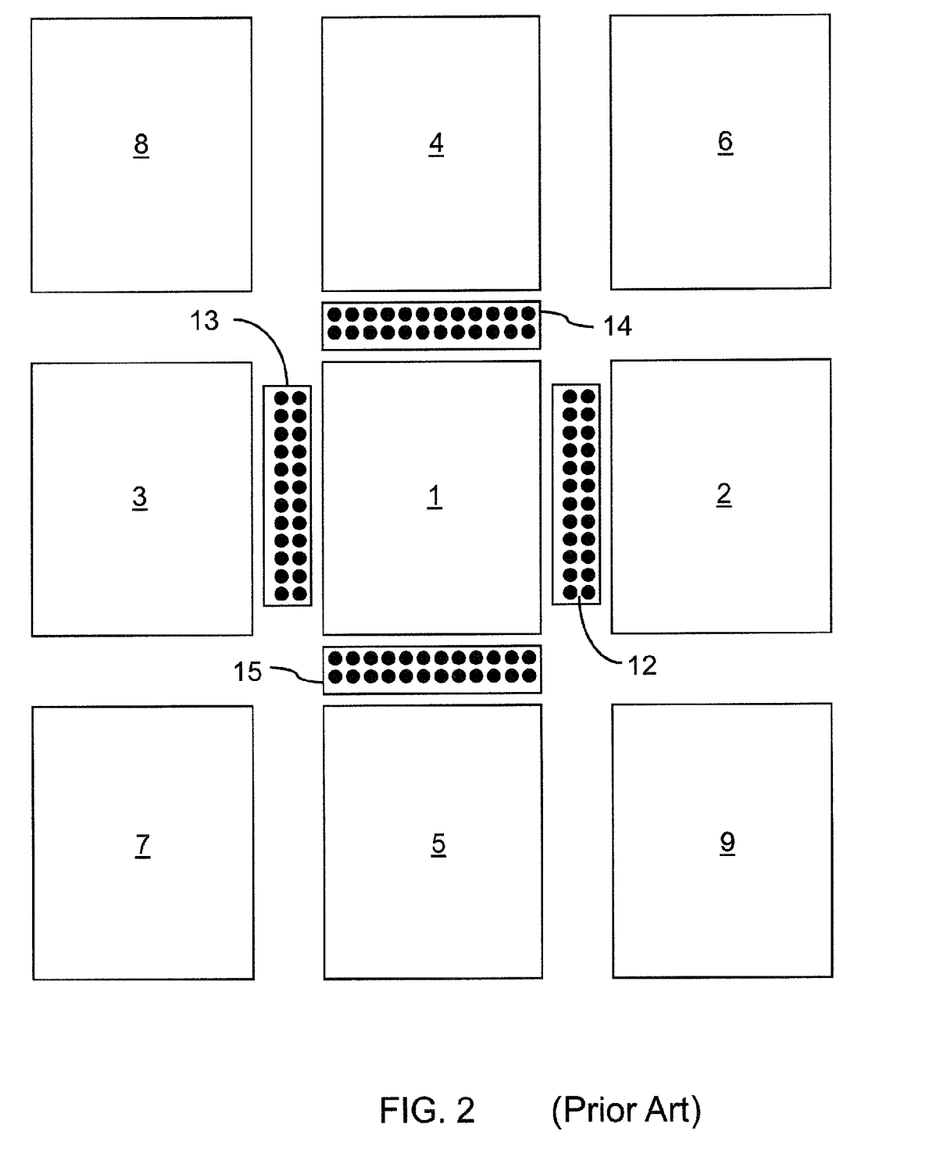
FIG. 2 is an exemplary prior art layout of functional blocks and interlayer interconnect structure arrays within a device-containing layer.

FIG. 2 shows an exemplary layout of functional blocks and interlayer interconnect structure arrays within a device-containing layer. The exemplar prior art layout includes a first functional block 1, a second functional block 2, a third functional block 3, a fourth functional block 4, a fifth functional block 5, a sixth functional block 6, a seventh functional block 7, an eighth functional block 8, a ninth functional block 9, a first interlayer interconnect structure array 12, a second interlayer interconnect structure array 13, a third interlayer interconnect structure array 14, and a fourth interlayer interconnect structure array 15. The first interlayer interconnect structure array 12 is located between the first functional block 1 and the second functional block 2, the second interlayer interconnect structure array 13 is located between the first functional block 1 and the third functional block 3, the third interlayer interconnect structure array 14 is located between the first functional block 1 and the fourth functional block 4, and the fourth interlayer interconnect structure array 15 is located between the first functional block 1 and the fifth functional block 5. Additional interlayer interconnect structure arrays that are not placed directly adjacent to the first functional block 1 are not shown for clarity. The placement of the interlayer interconnect structure arrays (12, 13, 14, 15) at the boundary between the first functional block 1 and other neighboring functional blocks (2, 3, 4, 5) minimized wiring length within the device-containing layer.

Three-dimensional integration provides various advantages for a semiconductor chip. Such advantages include reduced wirelength, increased packaging density, modularity, and heterogeneous integration of disparate technologies.

BRIEF SUMMARY

In the present invention, a method of designing a semiconductor chip including a plurality of device-containing layers is provided. In the first stage, block placement within each device-containing layer is optimized under the constraint of a simultaneous optimization of interlayer connectivity between the device-containing layer and immediately adjacent device-containing layers. For each functional block within the device-containing layer, lateral heat flow is calculated to laterally adjacent functional blocks. If the lateral heat flow is greater than a threshold value for a pair of adjacent functional blocks, modification of the interlayer interconnect structure array therebetween is not necessary. Otherwise, placement of the functional blocks and/or interlayer interconnect structure array therebetween or modification of the interlayer interconnect structure array is performed. This routine is repeated for all adjacent pairs of functional blocks in each of the device-containing layers.

In the second stage, block placement within each device-containing layer is optimized under the constraint of a simultaneous optimization of interlayer connectivity across all device-containing layers. The same routines may be employed for all adjacent pairs of functional blocks in each of the device-containing layers as in the first stage. The methods of the present invention provide a design having sufficient lateral heat flow in each of the device-containing layers in a semiconductor chip. The present invention may be implemented through an apparatus including a processor or a computing device and/or a machine-readable storage medium that includes a program for automatically executing the routines.

According to an aspect of the present invention, a method of designing a semiconductor chip including a plurality of device-containing layers is provided. The method includes: optimizing placement of functional blocks in a device-containing layer under a constraint of optimizing interlayer connectivity between the device-containing layer and at least one adjacent device-containing layer that is separated vertically from the device-containing layer; calculating, for a functional block in the device-containing layer, a value for lateral heat flow between the functional block and at least one adjacent functional block; determining if a value for lateral heat flow is less than a predetermined threshold value; modifying at least one of placement of the functional block, placement of the at least one adjacent functional block, placement of an interlayer interconnect structure array, and configuration of an interlayer interconnect structure array only if the value for lateral heat flow is less than the predetermined threshold value; and running a program using a processing device or a processor unit to execute one or more of the aforementioned optimizing, calculating, determining and modifying steps.

In one embodiment, the method further includes repeating determination of a value for lateral heat flow for each functional block in the device-containing layer; and repeating modification of at least one of placement of a functional block, placement of at least one adjacent functional block, placement of an interlayer interconnect structure array, and configuration of an interlayer interconnect structure array only if a corresponding value for lateral heat flow is less than the predetermined threshold value for each functional block in the device-containing layer.

In another embodiment, the method further includes: optimizing placement of functional blocks in another device-containing layer under a constraint of optimizing interlayer connectivity between the another device-containing layer and at least one adjacent device-containing layer that is separated vertically from the another device-containing layer; and calculating, for another functional block in the another device-containing layer, a value for lateral heat flow between the another functional block and at least one adjacent functional block.

In yet another embodiment, the method further includes: optimizing placement of functional blocks in the device-containing layer under a constraint of optimizing interlayer connectivity among all device-containing layers in a semiconductor chip; and calculating, for each functional block in the device-containing layer, a corresponding value for lateral heat flow between the each functional block and at least one adjacent functional block.

According to another aspect of the present invention, an apparatus configured to execute a program of machine-executable instructions to modify a design of a three-dimensionally integrated semiconductor chip is provided. The program includes the steps of: optimizing placement of functional blocks in a device-containing layer under a constraint of optimizing interlayer connectivity between the device-containing layer and at least one adjacent device-containing layer that is separated vertically from the device-containing layer; calculating, for a functional block in the device-containing layer, a value for lateral heat flow between the functional block and at least one adjacent functional block; determining if a value for lateral heat flow is less than a predetermined threshold value; and modifying at least one of placement of the functional block, placement of the at least one adjacent functional block, placement of an interlayer interconnect structure array, and configuration of an interlayer interconnect structure array only if the value for lateral heat flow is less than the predetermined threshold value.

According to yet another aspect of the present invention, a machine-readable data storage device embodying a program of machine-executable instructions to modify a design of a three-dimensionally integrated semiconductor chip is provided. The program includes the steps of: optimizing placement of functional blocks in a device-containing layer under a constraint of optimizing interlayer connectivity between the device-containing layer and at least one adjacent device-containing layer that is separated vertically from the device-containing layer; calculating, for a functional block in the device-containing layer, a value for lateral heat flow between the functional block and at least one adjacent functional block; determining if a value for lateral heat flow is less than a predetermined threshold value; and modifying at least one of placement of the functional block, placement of the at least one adjacent functional block, placement of an interlayer interconnect structure array, and configuration of an interlayer interconnect structure array only if the value for lateral heat flow is less than the predetermined threshold value.

DETAILED DESCRIPTION

As stated above, the present invention relates to methods of designing a three-dimensional semiconductor chip including a plurality of layers, an apparatus for effecting the methods, and a storage medium including an executable program for effecting the methods, which are now described in detail with accompanying figures. Like and corresponding elements are referred to by like reference numerals. Proportions of various elements in the accompanying figures are not drawn to scale.

As defined herein, a "three-dimensionally integrated semiconductor chip" refers to a semiconductor chip including at least two device-containing layers that are vertically stacked and electrically connected to effect electrical communication among the at least two device-containing layers.

As defined herein, a "device-containing layer" refers to a structure including a semiconductor layer and at least one metal interconnect layer located directly thereupon. Each device-containing layer is typically formed on a single semiconductor substrate by performing conventional semiconductor processing steps. A device-containing layer includes at least one semiconductor device, such as a field effect transistor, a bipolar transistor, diodes, etc., and typically includes at least one integrated circuit.

As defined herein, a "semiconductor layer" refers to a semiconductor substrate portion of the device-containing layer. The semiconductor layer comprises a semiconductor material, which is typically a single crystalline semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

As defined herein, a "metal interconnect layer" refers to a layer including a metal interconnect structure. A metal interconnect structure is typically embedded in at least one dielectric layer. A device-containing layer may have one metal interconnect layer located on the front side or the back side of a semiconductor layer, or may have two metal interconnect layers, one on the front side and the other on the back side. A metal interconnect layer may have one or a plurality of wiring levels therein. Typically, the wiring levels include a metal such as Cu, Al, and/or W.

As defined herein, a "functional block" refers to a unit of an integrated circuitry within a device-containing layer. A functional block may be a single chiplet or a set of multiple chiplets. Alternatively, a chiplet may be divided into multiple functional blocks. The size of the functional blocks may be determined based on predominant size of functionally distinct units within a device-containing layer, or may be determined based on a predetermined size that effect efficient calculation of lateral heat flow within the device-containing layer. Correspondingly, the boundary of each functional block may correspond to the function of a group of circuits, or may correspond to areas divided primarily based on an artificial grid structure introduced for the purposes of calculating thermal conduction within the device-containing layer.

As defined herein, an "interlayer interconnect structure array" refers to any set of conductive structures that provide electrically conductive path from one device-containing layer to another device-containing layer. Typically, an interlayer interconnect structure array is implemented using a "through-substrate via farm," which is an array of "through-substrate vias." The interlayer interconnect structure array may provide electrical connection between a pair of device-containing layers that are adjacent to each other, or may provide electrical connection among three or more device-containing layers.

As defined herein, a "through-substrate via" or a "TSV" refers to a conductive via structure that extends at least through a semiconductor layer, i.e., from a top surface of the semiconductor layer to a bottom surface of the semiconductor layer. The through-substrate via may extend through the entirety of a device-containing layer, or may extend only through the semiconductor layer but not through the metal interconnect layer. A through-substrate via provides an electrical connection between two device-containing layer either by itself or in combination with other metal interconnect structures embedded in the metal interconnect layer of a device-containing layer or an adjacent device-containing layer. Typically, through-substrate vias are very close to each other at a fine pitch, and are made of a metal with good electrical and thermal conduction such as Cu or W.

As defined herein, a "block index" refers to the integer assigned to each of functional block in a device-containing layer.

As defined herein, a "layer index" refers to the integer assigned to each of device-containing layers in a three-dimensionally integrated semiconductor chip.

As defined herein, "lateral heat flow" refers to the amount of heat transfer per unit time between one component of a device-containing layer to an adjacent component.

As defined herein, a "statistically representative quantity" refers to any statistical combination of an average, a mean, a median, a sum of an average and a multiple (including fractions) of a standard deviation, a percentile, a minimum, a maximum, etc. of an ensemble of values calculated for a set of multiple operating conditions for any device-containing layer.

As defined herein, "adjacent" refers to the state of physical placement of two components without any intervening component of the same character therebetween. If two device-containing layers are adjacent to each other, there is no other device-containing layer between the two device-containing layers. If two functional blocks are adjacent to each other, there is no other functional block between the two functional blocks. At least one interlayer interconnect structure array may be present between the two functional blocks that are adjacent to each other.

The present invention focuses on the thermal effect of interlayer interconnect structure arrays in a semiconductor chip, and provides a systematic method for minimizing the thermal impact of the presence of interlayer interconnect structure arrays. The interlayer interconnect structure arrays, such as through-substrate vias (TSV's), tend to create additional thermal barriers for heat conduction within a semiconductor layer. Because each interlayer interconnect structure array requires electrical isolation from a semiconductor layer, a dielectric insulation layer surrounds each interlayer interconnect structure array.

While the electrically conductive portions of the interlayer interconnect structure arrays are good thermal conductors capable of dispersing heat across multiple device-containing layers, dielectric insulation layers that surround the electrically conductive portions are poor thermal conductors. Thus, interlayer interconnect structure arrays, i.e., arrays of interlayer interconnect structure arrays, reduces lateral heat transfer within the semiconductor layer that embeds the interlayer interconnect structure arrays. In other words, the volume occupied by the dielectric insulation layer and the interlayer interconnect structure arrays within the semiconductor layer does not effectively conduct heat.

The present invention employs a systematic method for reducing the thermally adverse effect of interlayer interconnect structure arrays by determining conditions for modifying at least one of placement of a functional block, placement of at least one adjacent functional block, placement of an interlayer interconnect structure array, and configuration of an interlayer interconnect structure array for each functional block within each device-containing layer of a design for a three-dimensionally integrated semiconductor chip. Implementation of the present invention results in altered placement of functional blocks altered placement of interlayer interconnect structure arrays, and/or altered configurations for at least one interlayer interconnect structure array.

Figure 3:
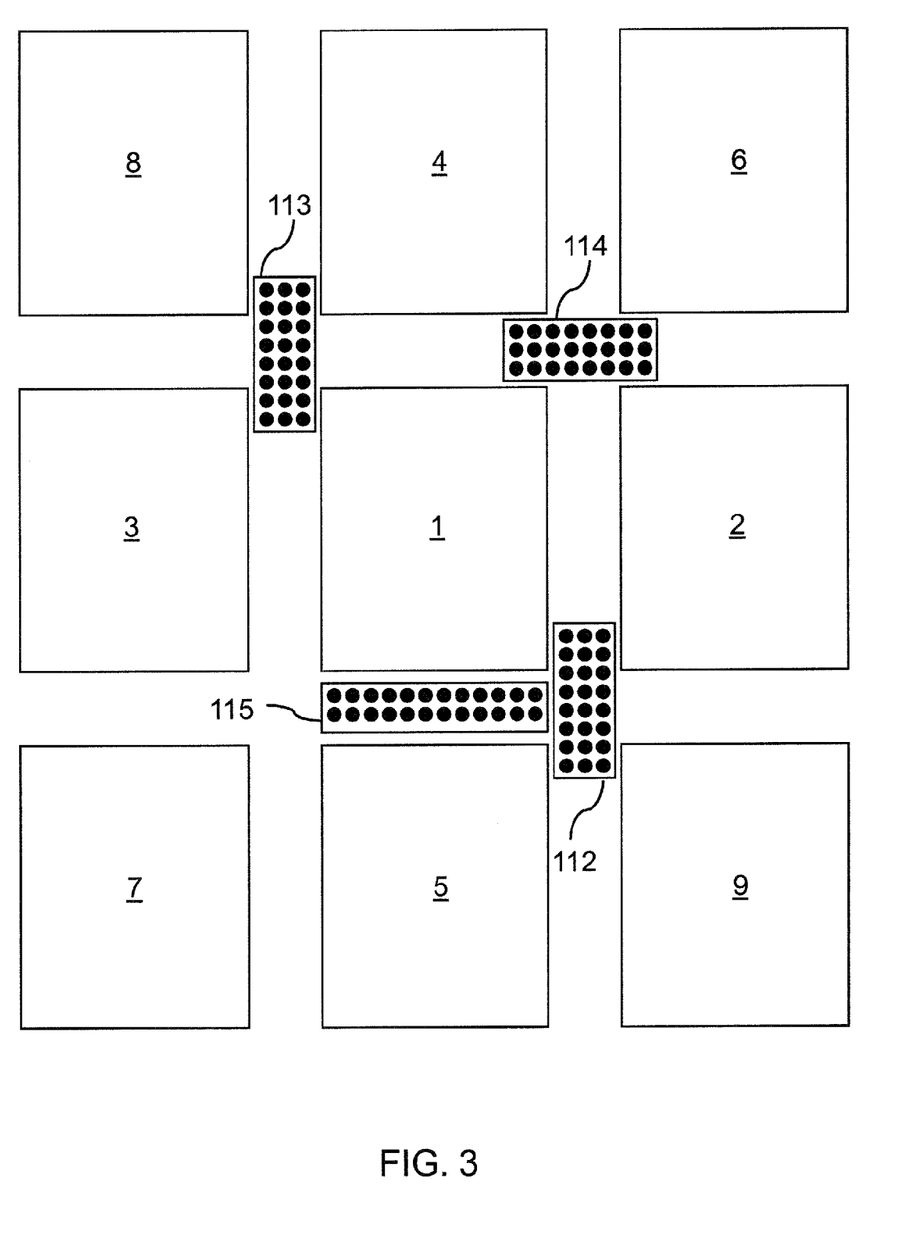
FIG. 3 is an exemplary layout of functional blocks and interlayer interconnect structure arrays within a device-containing layer according to the present invention.

Referring to FIG. 3, an exemplary layout of functional blocks and interlayer interconnect structure arrays within a device-containing layer are shown according to the present invention. The exemplary layout includes a first functional block 1, a second functional block 2, a third functional block 3, a fourth functional block 4, a fifth functional block 5, a sixth functional block 6, a seventh functional block 7, an eighth functional block 8, a ninth functional block 9, a first interlayer interconnect structure array 112, a second interlayer interconnect structure array 113, a third interlayer interconnect structure array 114, and a fourth interlayer interconnect structure array 115.

The exemplar layout of FIG. 3 may be a modification of the exemplary prior art layout of FIG. 2 obtained through applying the methods of the present invention. For example, application of the methods of the present invention to the layout in FIG. 2 may result in the determination that the lateral heat transfer between the first functional block 1 and the second functional block 2 is less than a predetermined threshold value, that the lateral heat transfer between the first functional block 1 and the third functional block 3 is less than the predetermined threshold value, that the lateral heat transfer between the first functional block 1 and the fourth functional block 4 is less than the predetermined threshold value, and that the lateral heat transfer between the first functional block 1 and the fifth functional block 5 is greater than the predetermined threshold value. Correspondingly, the first interlayer interconnect structure array 12 of FIG. 2 is replaced with the first interlayer interconnect structure array 112 of FIG. 3, the second interlayer interconnect structure array 13 of FIG. 2 is replaced with the second interlayer interconnect structure array 113 of FIG. 3, and the third interlayer interconnect structure array 14 of FIG. 2 is replaced with the third interlayer interconnect structure array 114 of FIG. 3. The fourth interlayer interconnect structure array 15 of FIG. 2 is not altered and becomes the fourth interlayer interconnect structure array 115 of FIG. 3. In this case, the design in FIG. 3 is a re-design of the design in FIG. 2 using the methods of the present invention.

As a consequence of the re-design, the lateral heat flow between the first functional block 1 and each of the second through fifth functional blocks (2, 3, 4, 5) is less than the predetermined threshold value, and a device-containing layer manufactured employing the design in FIG. 3 provides superior lateral thermal conductivity within the device-containing layer and superior performance due to reduce thermal degradation of performance.

The methods of the present invention are described below in greater detail employing various flow charts that illustrate the steps for re-designing a three-dimensionally integrated semiconductor chip.

The methods of the present invention are best effected by assigning a unique layer index i to all of the device-containing layers in a three-dimensionally integrated semiconductor chip with an integer from 1 to M, wherein M is the total number of device-containing layers in the three-dimensionally integrated semiconductor chip. The label of each functional block may be any alphanumeric. A complete set of the labels for all functional blocks in a device-containing layer may be character-mapped to a set of integers from 1 to M by a one-to-one mapping, wherein M is the total number of the functional blocks in that device-containing layer. The block index is an integer uniquely assigned to each device-containing layer, and has a value from 1 to M. Typically, the total number of device-containing layers M is from 2 to 50, and more typically, from 3 to 10, although greater values are also contemplated herein. Typically, the block index increases monotonically, or decreases monotonically, from the device-containing layer located at the bottommost part of the three-dimensionally integrated semiconductor chip to the device-containing layer located at the topmost part of the three-dimensionally integrated semiconductor chip with the physical distance. However, use of other schemes for allocation the layer indices, provided that there is a unique one-to-one mapping between each device-containing layer and the integers from 1 to M, is also contemplated herein.

Further, the methods of the present invention are best effected by assigning a unique layer index j to all of the functional blocks in each device-containing layer with the layer index i with an integer from 1 to N_i, wherein N_i is the total number of functional blocks in the device-containing layer with the layer index i. The label of each functional block may be any alphanumeric character. A complete set of the labels for all functional blocks in the i-th device-containing layer may be mapped to a set of integers from 1 to N_i by a one-to-one mapping. The block index is an integer uniquely assigned to each functional block within a given device-containing layer, and has a value from 1 to N_i for each i-th device-containing layer. For example, if the first device-containing layer has N__1 number of functional blocks, the block index runs from 1 to N__1 for the first device-containing layer, if the second device-containing layer has N__2 number of functional blocks, the block index runs from 1 to N__2 for the second device-containing layer, etc. In general, if a given device-containing layer has a total of N functional blocks, the block index for that device-containing layer runs from 1 to N.

Figure 4:
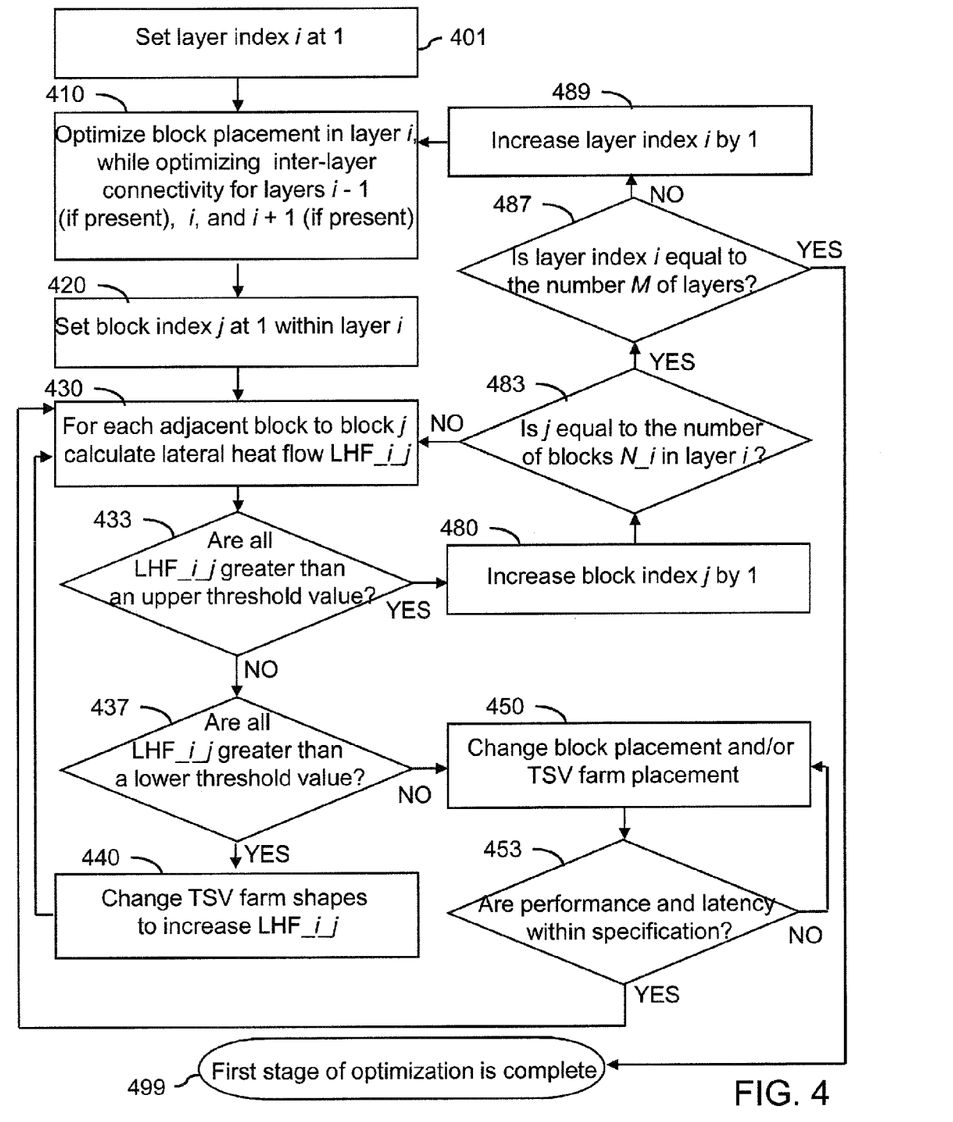
FIG. 4 is a first flow chart that shows the steps for a first stage optimization of a design of a three-dimensionally integrated semiconductor chip according to the present invention.

Referring to FIG. 4, a first flow chart shows the steps embodied as program instructions on program storage medium, e.g., a memory device such as magnetic readable hard disk or optically readable memory device for execution by computer drive or like processing apparatus to provide a first stage optimization of a design of a three-dimensionally integrated semiconductor chip according to the present invention.

Referring to step 401, the layer index i is set at 1. While the method in the first flow chart employs a simple incremental scheme for the layer index i to describe the present invention, any alternative scheme that covers all layer indices between 1 to M may be employed for the purposes of the present invention. With the setting of the layer index i at 1, the design of the first device-containing layer is manipulated first.

Referring to step 410, placement of functional blocks in the i-th device-containing layer is optimized under the constraint of optimizing interlayer connectivity between the i-th device-containing layer and at least one adjacent device-containing layer that is separated vertically from the i-th device-containing layer. Because the layer index i at 1 at this point, the i-th device-containing layer is the first device-containing layer and the at least one adjacent device-containing layer is the second device-containing layer. The (i−1)-th device-containing layer is not present if i is at 1. In general, if the layer index i is at a value between (and not including) 1 and M, the at least one adjacent device-containing layer that is separated vertically from the i-th device-containing layer includes two device-containing layers, i.e., the (i−1)-th device-containing layer and the (i+1)-th device-containing layer. If the layer index i is at M, the at least one adjacent device-containing layer that is separated vertically from the i-th device-containing layer includes only the (i−1)-th device-containing layer. The (i+1)-th device-containing layer is not present if i is at M.

Referring to step 420, the block index j is set at 1. While the method in the first flow chart employs a simple incremental scheme for the block index j to describe the present invention, any alternative scheme that covers all layer indices between 1 to N_i may be employed for the purposes of the present invention. With the setting of the layer index j at 1, the design of the first functional block in the i-th device-containing layer, which is the first device-containing layer at this point, is manipulated first.

Referring to step 430, lateral heat flow LHF_i_j for the j-th functional block in the i-th device-containing layer is calculated. The lateral heat flow LHF_i_j for the j-th functional block in the i-th device-containing layer is the amount of heat transfer per unit time between the j-th functional block in the i-th device-containing layer to an adjacent functional block. The j-th functional block, which is the first functional block when j is set at 1.

Since multiple adjacent functional blocks are present, the lateral heat flow LHF_i_j may include multiple values, each of which is calculated for the amount of heat transfer between the j-th functional block and one of the functional blocks located adjacent to the j-th functional block. Each of the multiple values corresponds to one of the functional blocks located adjacent to the j-th functional block. The amount of heat transfer per unit time may be calculated under various operating conditions of the components, such as functional blocks, of the i-th device-containing layer. The value of lateral heat flow may be calculated for a specific operating condition, or may be a statistically representative quantity (an average, a mean, a median, the sum of the average and a multiple of the standard deviation, a percentile, a minimum, a maximum, etc.) of an ensemble of values calculated for a set of multiple operating conditions. In other words, each value for lateral heat flow may be a calculated value for a single operating condition of the i-th device-containing layer, or may be a statistically representative quantity of an ensemble of values calculated for a set of multiple operating conditions for the i-th device-containing layer.

Subsequently, each value of the lateral heat flow LHF_i_j, which is calculated between the j-th functional block and one of the adjacent functional blocks, is compared with at least one predetermined threshold value for inter-block heat flow. Each of the at least one predetermined threshold value may be a fixed value irrespective of the interfacial width between adjacent functional blocks, or may be a value that is determined by multiplication of a predetermined constant with the interfacial width between adjacent functional blocks. The interfacial width refers to the width of a common boundary between a pair of adjacent functional blocks. The present invention provides multiple schemes for modifying the design of the i-th device-containing layer based on the at least one predetermined threshold value.

According to the methods for providing the first stage optimization, the at least one predetermined threshold value may include an upper threshold value and a lower threshold value. Referring to step 433, each value of the lateral heat flow LHF_i_j is compared with an upper threshold value for inter-block heat flow.

If each value of the lateral heat flow LHF_i_j is greater than the corresponding upper threshold value for all of adjacent functional blocks of the j-th functional block, the design of the i-th device-containing layer is not modified at this point, and the block index j is increased by 1 as shown in step 480. Thereafter, the value of the block index j after this increment is compared with the number of functional blocks N_i in the i-th device-containing layer as shown in step 483. If the value of the block index j after this increment is not equal to the number of functional blocks N_i in the i-th device-containing layer, i.e., less than the number of functional blocks N_i, the step 430 is repeated with the incremented block index j.

If the value of the block index j after this increment is equal to the number of functional blocks N_i in the i-th device-containing layer, this means that all functional blocks in the i-th device-containing layer has been adjusted at this point. In this case, the layer index i is compared with the total number M of the device-containing layers as shown in step 487. If the value of the layer index i is not equal to the number of the device-containing layers M in the three-dimensionally integrated semiconductor chip, i.e., less than the number of the device-containing layers M, the layer index i is incremented by 1 as shown in step 489. Thereafter, step 410 is performed again with the incremented layer index i.

If the value of the layer index i is equal to the number of the device-containing layers M in the three-dimensionally integrated semiconductor chip at step 487, this means that all functional blocks in all of the device-containing layers of the three-dimensionally integrated semiconductor chip have been evaluated and the design of all device-containing layers have been accordingly altered according to the present invention. In this case, the first stage of the optimization is complete as shown at step 499.

Referring back to step 433, if any of the values of the lateral heat flow LHF_i_j is not greater than the corresponding upper threshold value, which is may be the same or different for each of adjacent functional blocks of the j-th functional block, the design of the i-th device-containing layer is modified in some way. At this point, the method of the present invention employs modification of at least one of the placement of the j-th functional block, the placement of the at least one adjacent functional block, i.e., at least one functional block that is adjacent to the j-th functional block, the placement of an interlayer interconnect structure array, and the configuration of an interlayer interconnect structure array located between the j-th functional block and the adjacent functional blocks thereof. The modification of the above design elements occurs only if at least one of the values for lateral heat flow is less than the predetermined threshold value. Broadly, the modification steps correspond to steps 437, 440, 450, and 453 in FIG. 4.

The process flow proceeds to step 437, where each value of the lateral heat flow LHF_i_j is compared with a lower threshold value for inter-block heat flow. Each lower threshold value is equal to or less than the corresponding upper threshold value, which corresponds to the same pair of functional blocks that include the j-th functional block in the i-th device-containing layer and one of the adjacent functional blocks of the j-th functional block.

If each value of the lateral heat flow LHF_i_j is greater than the corresponding lower threshold value for all of adjacent functional blocks of the j-th functional block, the process flow proceeds to step 440. At step 440, the shape, or the configuration, of at least one interlayer interconnect structure array, such as at least one TSV farm, is modified. Modification of the at least one interlayer interconnect structure array may be effected by selecting an alternative type of interlayer interconnect structure array or altering at least one parameter of the at least one interlayer interconnect structure array if the at least one interlayer interconnect structure array includes a P-cell. A "P-cell" refers to a parameterized cell of which at least one parameter, such as a width, a length, or a shape, may be altered by changing the corresponding design parameter. The design of the i-th device-containing layer is modified only by modifying the configuration of at least one interlayer interconnect structure array, but the placement of the functional blocks and the interlayer interconnect structure arrays is not modified at this step. The process flow then proceeds to step 430 to evaluate the effectiveness of the changes to the design of the at least one interlayer interconnect structure array in the i-th device-containing layer.

If at least one value of the lateral heat flow LHF_i_j is equal to or less than the corresponding lower threshold value for the adjacent functional blocks of the j-th functional block, the process flow proceeds to step 450. At step 450, the placement of the functional blocks and the interlayer interconnect structure arrays are modified. Specifically, the placement of the the j-th functional block in the i-th device-containing layer, the placement of the functional blocks adjacent to the j-th functional block, and/or the placement of the at least one interlayer interconnect structure array are modified. In addition, the shape, or the configuration, of at least one interlayer interconnect structure array that is located around the j-th functional block may also be modified. Thus, the design of the i-th device-containing layer may be modified by altering the placement of the functional blocks and the interlayer interconnect structure arrays as well as optionally modifying the configuration of at least one interlayer interconnect structure array.

After modifying at least one of placement of the functional block, placement of the at least one adjacent functional block, and placement of an interlayer interconnect structure array, at least one performance parameter of the i-th device-containing layer is calculated at step 450. The at least one performance parameter includes at least one parameter for quantifying the performance of the i-th device-containing layer, and may include a parameter for measuring latency within the i-th device-containing layer. The at least one performance parameter is compared with the specification for the i-th device-containing layer to determine whether the modifications to the design introduced at step 450 provides a design that meets the specification for the i-th device-containing layer as far as the at least one performance parameter is concerned.

If the re-design of the i-th device-containing layer provided at step 450 meets the specification for at least one performance parameter, the process flow then proceeds to step 430 to evaluate the effectiveness of the changes to the design of the i-th device-containing layer. If the re-design of the i-th device-containing layer provided at step 450 does not meet the specification for at least one performance parameter, the process flow proceeds to step 450 to provide additional modifications to the placement of the j-th functional block in the i-th device-containing layer, the placement of the functional blocks adjacent to the j-th functional block, and/or the placement of the at least one interlayer interconnect structure array.

Through the iterative nature of the processing sequence in the first flow chart, step 430 is performed for each functional block in all the device-containing layers of the three-dimensionally integrated semiconductor chip as the combination of the block index j and the layer index i encompasses every functional block. Thus, the determination of at least one value for lateral heat flow and the accompanying conditional modification of at least one of placement of the functional block, placement of at least one adjacent functional block, placement of an interlayer interconnect structure array, and configuration of an interlayer interconnect structure array is performed for each functional block in each of the device-containing layers. The conditional modification occurs only if a corresponding value for lateral heat flow is less than the predetermined threshold value for each functional block in the device-containing layer.

FIG. 4 provides two types of modification schemes during the re-design of the semiconductor chip. The repeated modification of at least one of placement of a functional block, placement of at least one adjacent functional block, placement of an interlayer interconnect structure array, and configuration of an interlayer interconnect structure array is contingent to the condition that a corresponding value for lateral heat flow is less than the predetermined upper threshold value for each indexed functional block as determined at step 433.

The re-design of the three-dimensionally integrated semiconductor chip proceeds from one device-containing layer to the next as the layer index i increases from 1 to M until all device-containing layers are re-designed. Once the first stage of optimization is complete, for example, at step 499, a second stage of optimization may be performed.

Figure 5:
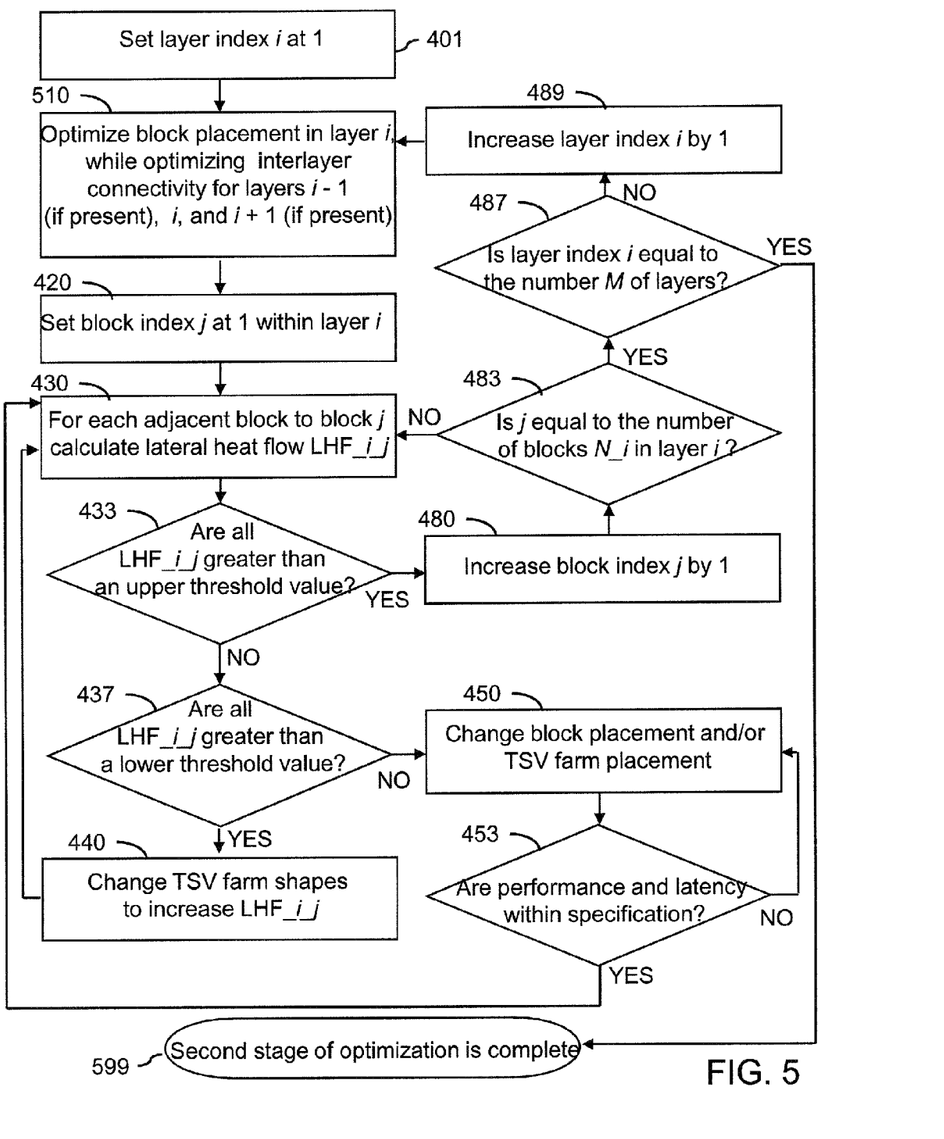
FIG. 5 is a second flow chart that shows the steps for a second stage optimization of a design of the three-dimensionally integrated semiconductor chip according to the present invention.

Referring to FIG. 5, a second flow chart shows the steps for a second stage optimization of a design of the three-dimensionally integrated semiconductor chip according to the present invention. The second flow chart employs the same steps as the first flow chart except for the substitution of step 510 for step 410 and the substitution of step 599 for step 499.

At step 510, placement of functional blocks in the i-th device-containing layer is optimized under the constraint of optimizing interlayer connectivity among all device-containing layers in the three-dimensionally integrated semiconductor chip. Thus, the optimization constraint for interlayer connectivity is more stringent in the second stage optimization employing the method steps as depicted in the second flow chart than the first stage optimization employing the method steps as depicted in the first flow chart.

Subsequent processing steps other than step 599 in the second flow chart are substantially the same as in the first flow chart. At step 599, the second stage of optimization is complete.

Variations of the embodiment employing the first and second stages of optimization employing the first and second flow charts of FIGS. 4 and 5, in which the first stage of optimization or the second stage of optimization is omitted, are also contemplated herein.

Figure 6:
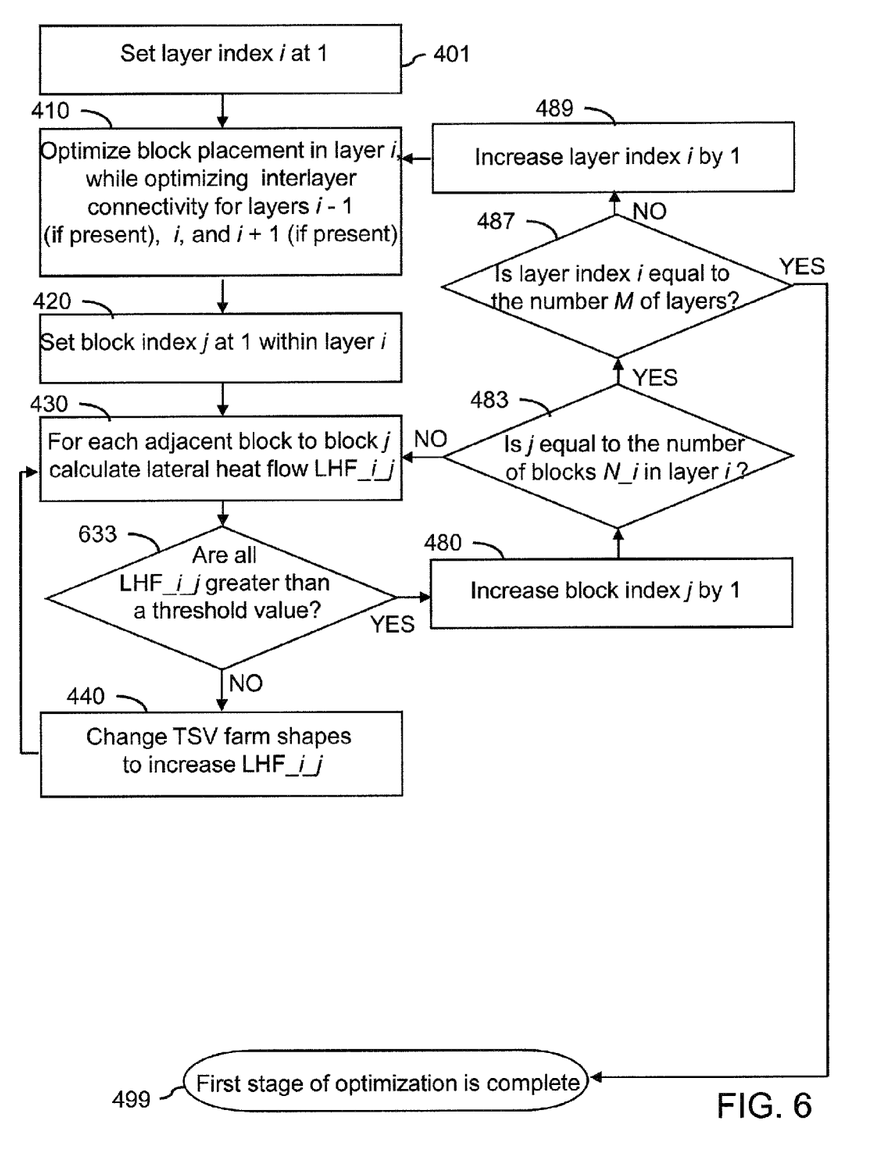
FIG. 6 is a third flow chart that shows first alternative steps for a first stage optimization of the design of a three-dimensionally integrated semiconductor chip according to the present invention.

Referring to FIG. 6, a third flow chart shows first alternative steps for a first stage optimization of the design of a three-dimensionally integrated semiconductor chip according to the present invention. In the third flow chart, only one type of the at least one threshold value is employed, which is herein referred to a threshold value. Step 433 of the first flow chart is replaced with step 633 in the third flow chart.

At step 633, each value of the lateral heat flow LHF_i_j is compared with a threshold value for inter-block heat flow. If each value of the lateral heat flow LHF_i_j is greater than the corresponding threshold value for all of adjacent functional blocks of the j-th functional block, the design of the i-th device-containing layer is not modified at this point, and the block index j is increased by 1 as shown in step 480. Subsequent processing steps in this case are identical to the processing steps of the first flow chart in FIG. 4.

If any of the values of the lateral heat flow LHF_i_j is not greater than the corresponding threshold value at step 633, the process flow proceeds to step 440. The corresponding threshold value at step 633 may be the same or different for each of adjacent functional blocks of the j-th functional block. At step 440, the i-th device-containing layer is re-designed through modification of the configuration of an interlayer interconnect structure array located between the j-th functional block and the adjacent functional blocks thereof. The modification of the above design elements occurs only if at least one of the values for lateral heat flow is less than the predetermined threshold value.

The third flow chart employs only modification of the configuration, i.e., the shape, of an interlayer interconnect structure array, but does not modify the placement of any functional block or the placement of any interlayer interconnect structure array.

Figure 7:
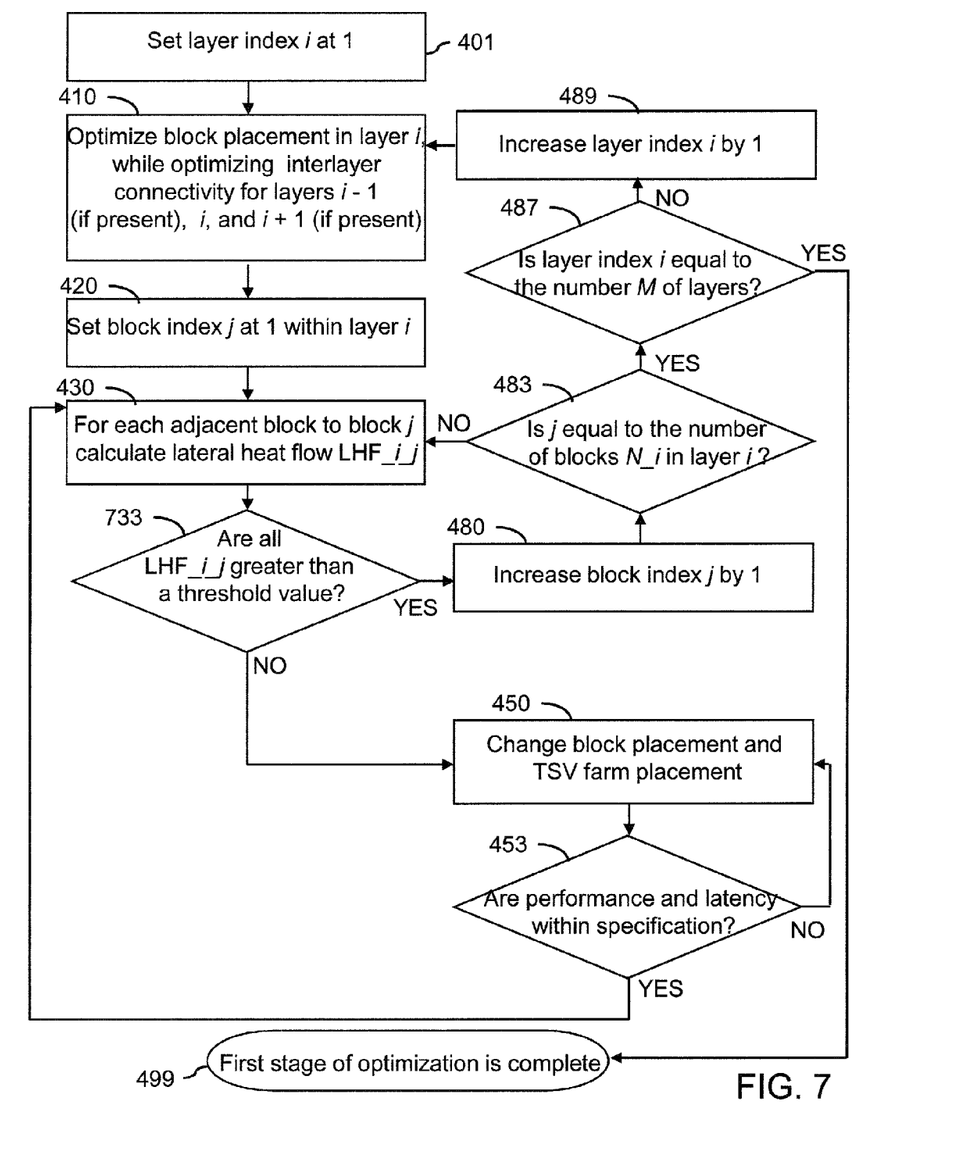
FIG. 7 is a fourth flow chart that shows second alternative steps for a first stage optimization of the design of a three-dimensionally integrated semiconductor chip according to the present invention.

Referring to FIG. 7, a fourth flow chart shows second alternative steps for a first stage optimization of the design of a three-dimensionally integrated semiconductor chip according to the present invention. In the fourth flow chart, only one type of the at least one threshold value is employed, which is herein referred to a threshold value. Step 433 of the first flow chart is replaced with step 733 in the fourth flow chart.

At step 733, each value of the lateral heat flow LHF_i_j is compared with a threshold value for inter-block heat flow. If each value of the lateral heat flow LHF_i_j is greater than the corresponding threshold value for all of adjacent functional blocks of the j-th functional block, the design of the i-th device-containing layer is not modified at this point, and the block index j is increased by 1 as shown in step 480. Subsequent processing steps in this case are identical to the processing steps of the first flow chart in FIG. 4.

If any of the values of the lateral heat flow LHF_i_j is not greater than the corresponding threshold value at step 733, the process flow proceeds to step 450. The corresponding threshold value at step 733 may be the same or different for each of adjacent functional blocks of the j-th functional block. At step 450, the placement of the functional blocks and the interlayer interconnect structure arrays are modified. Specifically, the placement of the j-th functional block in the i-th device-containing layer, the placement of the functional blocks adjacent to the j-th functional block, and/or the placement of the at least one interlayer interconnect structure array are modified in the same manner as in the first flow chart of FIG. 4. In addition, the shape, or the configuration, of at least one interlayer interconnect structure array that is located around the j-th functional block may also be modified. The modification of the above design elements occurs only if at least one of the values for lateral heat flow is less than the predetermined threshold value.

The fourth flow chart employs only modification of the placement of any functional block or the placement of any interlayer interconnect structure array, but does not modify the configuration, i.e., the shape, of an interlayer interconnect structure array.

Figure 8:
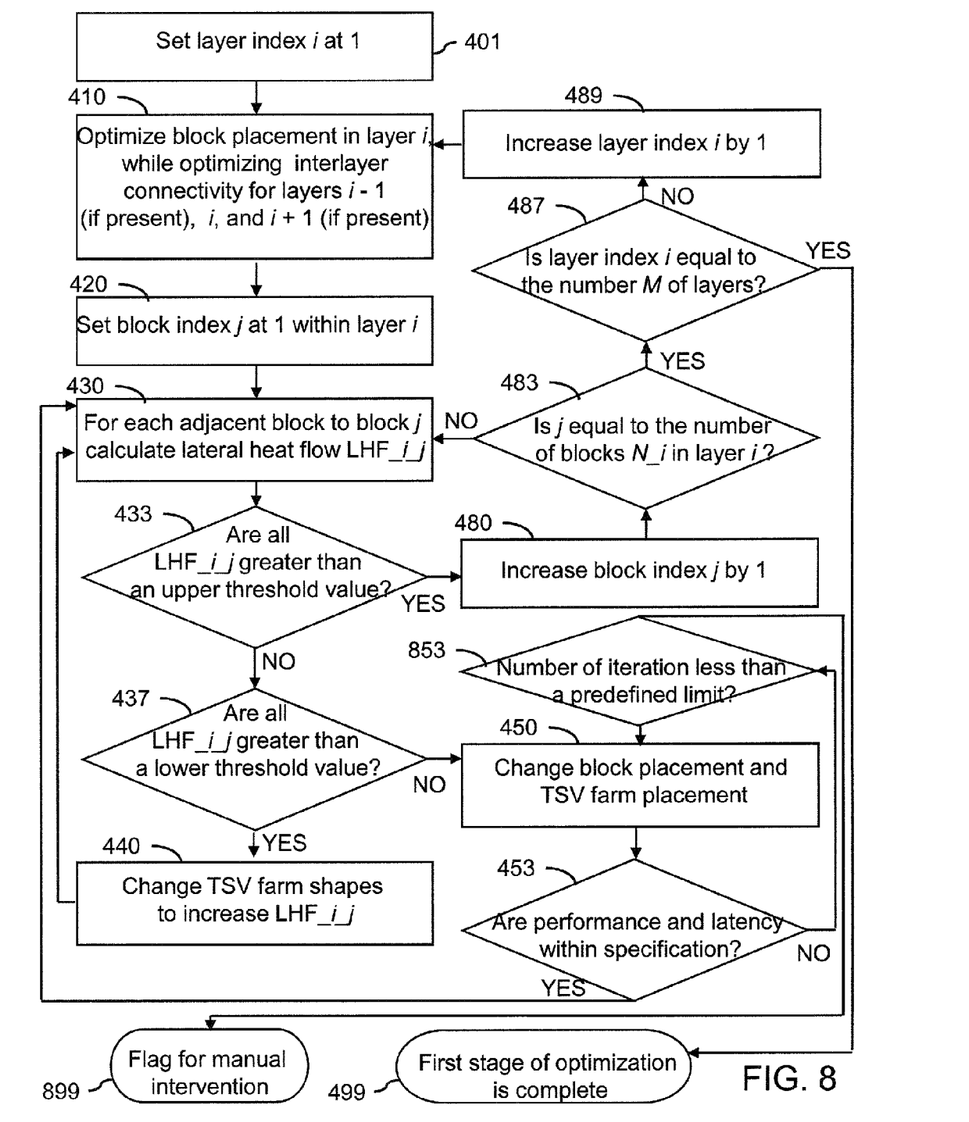
FIG. 8 is a fifth flow chart that shows third alternative steps for a first stage optimization of the design of a three-dimensionally integrated semiconductor chip according to the present invention.

Referring to FIG. 8, a fifth flow chart shows third alternative steps for a first stage optimization of the design of a three-dimensionally integrated semiconductor chip according to the present invention. The fifth flow chart adds additional steps 853 and 899 to the steps of the first flow chart.

At each iterative re-design loop employing steps 450 and 453, the additional step 853 counts the number of iterations and compares that count with a predetermined limit for the number of iterations, i.e., the maximum iteration loop count. The maximum iteration loop count is a number of allowed failures in the attempt to meet the design specification through the re-design loop including steps 450 and 453. The maximum iteration loop count may be from 1,000 to 1,000,000, although lesser and greater numbers are also contemplated herein. If the re-design attempts continually fail to meet the performance specification throughout the iterations up to the maximum iteration loop count, the re-design task is deemed to be impossible, and the processing step proceeds to step 899 to flag for manual intervention. If step 899 is reached, changes in the design specification or a new design may be introduced.

The present invention may be implemented in an apparatus configured to execute a program of machine-executable instructions to modify a design of a three-dimensionally integrated semiconductor chip. The program may include the steps described above for the various flow charts of the present invention. Particularly, the apparatus may be a computer, which may be a stand-alone computer or an array of computers connected to execute the program of the present invention in tandem.

The present invention may also employ a machine-readable data storage device embodying a program of machine-executable instructions to modify a design of a three-dimensionally integrated semiconductor chip. The program may include the steps described above for the various flow charts of the present invention. Particularly, the machine-readable data storage device may be a portable memory device that is readable by a computer or a built-in component of a computer.

Figure 9:
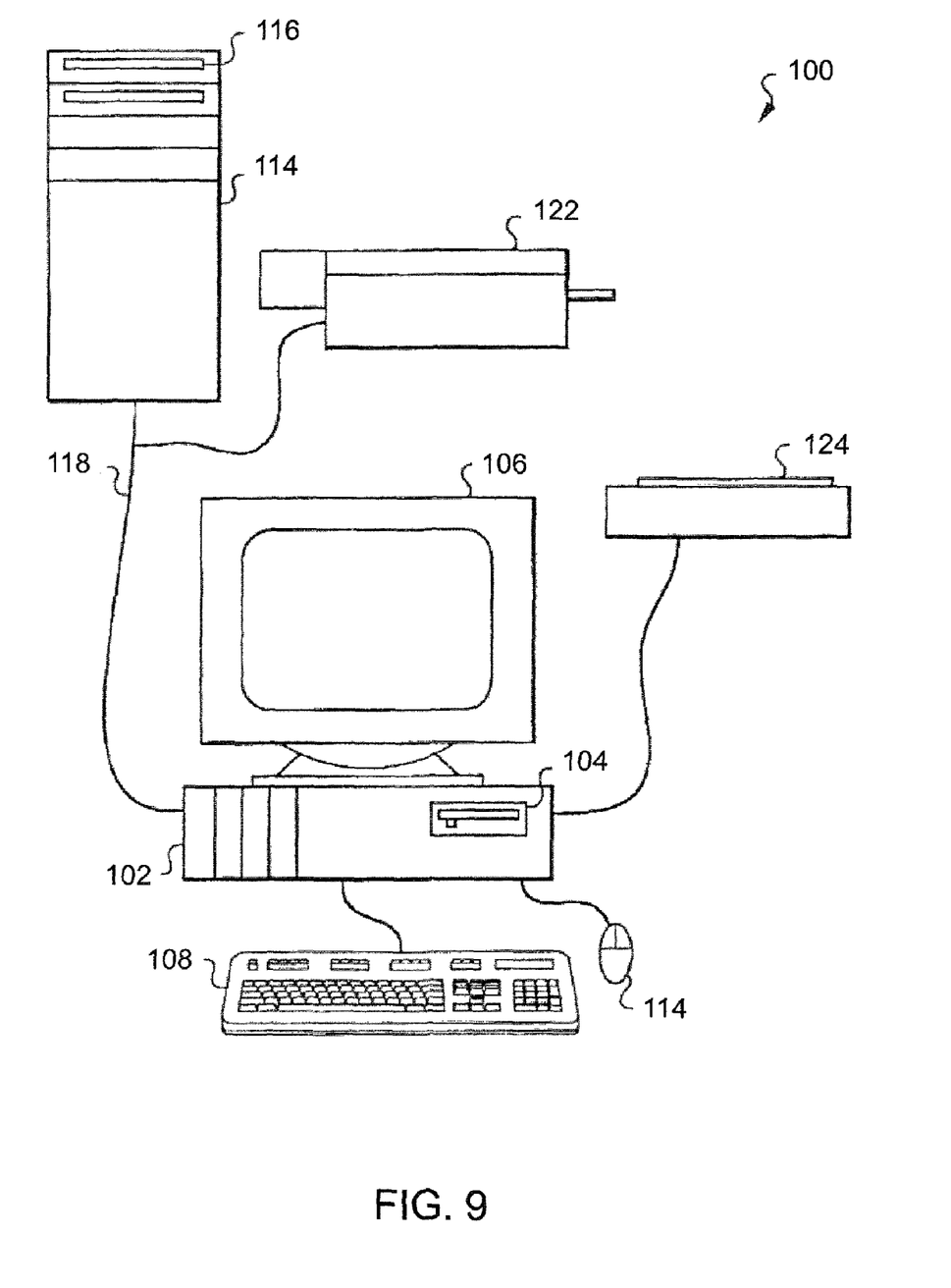
FIG. 9 is an illustration of a computer-based system in which a method embodiment of the invention may be carried out.

Referring to FIG. 9, A computer-based system 100 in which a method embodiment of the invention may be carried out is depicted. The computer-based system 100 includes a processing unit 110, which houses a processor, memory and other systems components (not shown expressly in the drawing) that implement a general purpose processing system, or computer that may execute a computer program product. The computer program product may comprise media, for example a compact storage medium such as a compact disc, which may be read by the processing unit 110 through a disc drive 120, or by any means known to the skilled artisan for providing the computer program product to the general purpose processing system for execution thereby.

The computer program product may comprise all the respective features enabling the implementation of the inventive method described herein, and which—when loaded in a computer system—is able to carry out the method. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer program product may be stored on hard disk drives within processing unit 110, as mentioned, or may be located on a remote system such as a server 130, coupled to processing unit 110, via a network interface such as an Ethernet interface. Monitor 140, mouse 150 and keyboard 160 are coupled to the processing unit 110, to provide user interaction. Scanner 180 and printer 170 are provided for document input and output. Printer 170 is shown coupled to the processing unit 610 via a network connection, but may be coupled directly to the processing unit. Scanner 180 is shown coupled to the processing unit 110 directly, but it should be understood that peripherals might be network coupled, or direct coupled without affecting the ability of the processing unit 110 to perform the method of the invention.

The present invention enhances the performance of the re-designed semiconductor chip by taking into account the thermal characteristics of individual device-containing layers into consideration. Thus, heating of the various portions of each device-containing is managed through the present invention. The present invention prevents a substantial increase in the temperature of the stack of device-containing layers despite the increase in the number of the device-containing layers. The benefit of the present invention become even more pronounced as the number of device-containing layers increases because each device-containing layers generates heat and the dielectric layers in the metal interconnect layer tend to thermally isolate adjacent semiconductor layers.

In addition, as the number of device-containing layers increases beyond two, the three-dimensional stack in a three-dimensionally integrated semiconductor chip incorporates thinned semiconductor layers in order to effectively use the reduced wirelength in the vertical direction, i.e., the reduced physical distance between the plurality of device-containing layers. Such thinning of the semiconductor layers exacerbates localized heating within the three-dimensionally integrated semiconductor chip since heat cannot effectively dissipate in the lateral direction from a hotspot, i.e., a region in a semiconductor layer that generates more heat than surrounding areas during operation of the semiconductor chip, into neighboring blocks within the same device-containing layer. The present invention provides a counterbalancing method to decrease the thermally adverse impact on the performance of a three-dimensionally integrated semiconductor chip by providing a systematic method for managing heat.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of designing a semiconductor chip including a plurality of device-containing layers, said method comprising steps of:

optimizing placement of functional blocks in a device-containing layer under a constraint of optimizing interlayer connectivity between said device-containing layer and at least one adjacent device-containing layer that is separated vertically from said device-containing layer;

calculating, for a functional block among said functional blocks in said device-containing layer, a value for lateral heat flow between said functional block and at least one adjacent functional block among said functional blocks in said device-containing layer;

determining if said value for lateral heat flow is less than a predetermined threshold value;

modifying one or more of placement of said functional block, placement of said at least one adjacent functional block, placement of an interlayer interconnect structure array providing electrically conductive paths from said device-containing layer to another device-containing layer, and configuration of said interlayer interconnect structure array only if said value for lateral heat flow is less than said predetermined threshold value; and running a program using a processing device or a processor unit to execute one or more of said optimizing, calculating, determining and modifying steps.

2. The method of claim 1, further comprising repeating determination of a value for lateral heat flow for each functional block in said device-containing layer.

3. The method of claim 2, further comprising repeating, for said each functional block in said device-containing layer, modification of at least one of placement of said each functional block, placement of at least another adjacent functional block that is among said functional blocks and is located adjacent to said each functional block, placement of said interlayer interconnect structure array, and configuration of said interlayer interconnect structure array only if a corresponding value for lateral heat flow is less than said predetermined threshold value.

4. The method of claim 1, further comprising:
assigning a unique block index to all of functional blocks in said device-containing layer with an integer from 1 to N, wherein N is the total number of functional blocks in said device-containing layer; and repeating, for each indexed functional block in the order of said unique block index, calculation of a value for lateral heat flow between said each indexed functional block and at least one adjacent functional block that is among said functional blocks and is located adjacent to said each functional block.

5. The method of claim 4, further comprising repeating, for each indexed functional block in the order of said unique block index, modification of at least one of placement of said each indexed functional block, placement of at least another adjacent functional block that is among said functional blocks and is located adjacent to said each indexed functional block, placement of said interlayer interconnect structure array or another interlayer interconnect structure array that is configured to provide electrically conductive paths from said device-containing layer to another device-containing layer, and configuration of said interlayer interconnect structure array or said another interlayer interconnect structure array only if a corresponding value for lateral heat flow is less than said predetermined threshold value for each indexed functional block.

6. The method of claim 1, wherein said value for lateral heat flow is a calculated value for a single operating condition of said device-containing layer or a statistically representative quantity of an ensemble of values calculated for a set of multiple operating conditions for said device-containing layer.

7. The method of claim 1, further comprising:
determining if said value for lateral heat flow is less than another predetermined threshold value; and modifying at least one of placement of said functional block, placement of said at least one adjacent functional block, and placement of said interlayer interconnect structure array only if said another value for lateral heat flow is less than said another predetermined threshold value.

8. The method of claim 7, further comprising determining at least one performance parameter after modifying said at least one of placement of said functional block, placement of said at least one adjacent functional block, and placement of said interlayer interconnect structure array.

9. The method of claim 1, further comprising:
optimizing placement of functional blocks in another device-containing layer under a constraint of optimizing interlayer connectivity between said another device-containing layer and said at least one adjacent device-containing layer, wherein said at least one adjacent device-containing layer is separated vertically from said another device-containing layer; and calculating, for a functional block in said another device-containing layer, a value for lateral heat flow between said another functional block and at least one adjacent functional block that is located within said another device-containing layer and is adjacent to said functional block in said another device-containing layer.

10. The method of claim 9, further comprising
repeating, for each functional block in said another device-containing layer, determination of a value for lateral heat flow; and repeating, for each functional block in said another device-containing layer, modification of at least one of placement of said each functional block, placement of at least one adjacent functional block that is located adjacent to said each functional block and within said another device-containing layer, placement of another interlayer interconnect structure array configured to provide electrically conductive paths from said another device-containing layer to a device-containing layer that can be said device-containing layer or yet another device-containing layer, and configuration of said another interlayer interconnect structure array only if a corresponding value for lateral heat flow is less than said predetermined threshold value.

11. The method of claim 9, further comprising:
optimizing placement of functional blocks in said device-containing layer under a constraint of optimizing interlayer connectivity among all device-containing layers in a semiconductor chip that includes said device-containing layer; and calculating, for each functional block in said device-containing layer, a corresponding value for lateral heat flow between said each functional block and at least one adjacent functional block that is located within said device-containing layer and is adjacent to said each functional block.

12. The method of claim 11, further comprising:
determining if said corresponding value for lateral heat flow is less than said predetermined threshold value; and modifying at least one of placement of said each functional block, placement of said at least one adjacent functional block, placement of said interlayer interconnect structure array, and configuration of said interlayer interconnect structure array only if said corresponding value for lateral heat flow is less than said predetermined threshold value.

13. An apparatus configured to execute a program of machine-executable instructions to modify a design of a three-dimensionally integrated semiconductor chip, wherein said program includes steps of:
    optimizing placement of functional blocks in a device-containing layer under a constraint of optimizing interlayer connectivity between said device-containing layer and at least one adjacent device-containing layer that is separated vertically from said device-containing layer;
    calculating, for a functional block in said device-containing layer, a value for lateral heat flow between said functional block and at least one adjacent functional block among said functional blocks in said device-containing layer;
    determining if said value for lateral heat flow is less than a predetermined threshold value; and
    modifying at least one of placement of said functional block, placement of said at least one adjacent functional block, placement of an interlayer interconnect structure array configured to provide electrically conductive path from said device-containing layer to another device-containing layer, and configuration of said interlayer interconnect structure array only if said value for lateral heat flow is less than said predetermined threshold value.

14. The apparatus of claim 13, wherein said program further comprises a step of repeating determination of a value for lateral heat flow for each functional block in said device-containing layer.

15. The apparatus of claim 14, wherein said program further comprises a step of repeating, for each functional block in said device-containing layer, modification of at least one of placement of said each functional block, placement of at least another adjacent functional block that is among said functional blocks and is located adjacent to said each functional block, placement of said interlayer interconnect structure array, and configuration of said interlayer interconnect structure array only if a corresponding value for lateral heat flow is less than said predetermined threshold value.

16. The apparatus of claim 13, wherein said program further comprises steps of:
    optimizing placement of functional blocks in said another device-containing layer under a constraint of optimizing interlayer connectivity between said another device-containing layer and said at least one adjacent device-containing layer, wherein said at least one adjacent device-containing layer is separated vertically from said another device-containing layer; and
    calculating, for a functional block in said another device-containing layer, a value for lateral heat flow between said another functional block and at least one adjacent functional block that is located within said another device-containing layer and is adjacent to said functional block in said another device-containing layer.

17. The apparatus of claim 16, wherein said program further comprises:
    optimizing placement of functional blocks in said device-containing layer under a constraint of optimizing interlayer connectivity among all device-containing layers in a semiconductor chip that includes said device-containing layer; and
    calculating, for each functional block in said device-containing layer, a corresponding value for lateral heat flow between said each functional block and at least one adjacent functional block that is located within said device-containing layer and is adjacent to said each functional block.

18. The apparatus of claim 13, wherein said apparatus is a computer.

19. A non-transitory machine-readable data storage device embodying a program of machine-executable instructions to cause a processing device or a processor unit to modify a design of a three-dimensionally integrated semiconductor chip, wherein said program includes steps of:
    optimizing placement of functional blocks in a device-containing layer under a constraint of optimizing interlayer connectivity between said device-containing layer and at least one adjacent device-containing layer that is separated vertically from said device-containing layer;
    calculating, for a functional block in said device-containing layer, a value for lateral heat flow between said functional block and at least one adjacent functional block among said functional blocks in said device-containing layer;
    determining if said value for lateral heat flow is less than a predetermined threshold value; and
    modifying at least one of placement of said functional block, placement of said at least one adjacent functional block, placement of an interlayer interconnect structure array configured to provide electrically conductive path from said device-containing layer to another device-containing layer, and configuration of said interlayer interconnect structure array only if said value for lateral heat flow is less than said predetermined threshold value.

20. The non-transitory machine-readable data storage device of claim 19, wherein said program further comprises a step of repeating determination of a value for lateral heat flow for each functional block in said device-containing layer.

21. The non-transitory machine-readable data storage device of claim 20, wherein said program further comprises a step of repeating, for each functional block in said device-containing layer, modification of at least one of placement of said each functional block, placement of at least another adjacent functional block that is among said functional blocks and is located adjacent to said each functional block, placement of said interlayer interconnect structure array, and configuration of said interlayer interconnect structure array only if a corresponding value for lateral heat flow is less than said predetermined threshold value.

22. The non-transitory machine-readable data storage device of claim 19, wherein said program further comprises steps of:
    optimizing placement of functional blocks in said another device-containing layer under a constraint of optimizing interlayer connectivity between said another device-containing layer and said at least one adjacent device-containing layer, wherein said at least one adjacent device-containing layer is separated vertically from said another device-containing layer; and
    calculating, for a functional block in said another device-containing layer, a value for lateral heat flow between said another functional block and at least one adjacent functional block that is located within said another device-containing layer and is adjacent to said functional block in said another device-containing layer.

23. The non-transitory machine-readable data storage device of claim 22, wherein said program further comprises:
  optimizing placement of functional blocks in said device-containing layer under a constraint of optimizing inter-layer connectivity among all device-containing layers in a semiconductor chip that includes said device-containing layer; and
  calculating, for each functional block in said device-containing layer, a corresponding value for lateral heat flow between said each functional block and at least one adjacent functional block that is located within said device-containing layer and is adjacent to said each functional block.

24. The non-transitory machine-readable data storage device of claim 19, wherein said machine-readable data storage device is a portable memory device that is readable by a computer or a built-in component of a computer.

* * * * *